United States Patent [19]
Lundh et al.

[11] Patent Number: 5,724,360
[45] Date of Patent: Mar. 3, 1998

[54] COMPOSITE CLOCK SIGNAL

[75] Inventors: Peter Carl Binger Lundh, Farsta; Mats Göran Wilhelmsson, Stockholm, both of Sweden

[73] Assignee: Telefonaktiebolaget LM Ericsson, Stockholm, Sweden

[21] Appl. No.: 231,016

[22] Filed: Apr. 21, 1994

[30] Foreign Application Priority Data

Apr. 21, 1993 [SE] Sweden ................. 9301327

[51] Int. Cl.$^6$ .................................................. H04J 3/06
[52] U.S. Cl. .................. 370/516; 375/359; 375/376; 370/513; 370/522; 370/503
[58] Field of Search .................. 370/105.3, 105.1, 370/100.1, 69.1, 16, 18, 104.1, 106, 110.1, 48, 118, 516, 579, 503, 430, 252, 511, 513, 522, 477, 305; 375/111, 116, 118, 119, 120, 261, 362, 368, 371, 373, 376, 333, 305, 359, 365, 366

[56] References Cited

U.S. PATENT DOCUMENTS

| | | | |
|---|---|---|---|
| 3,980,953 | 9/1976 | Nance et al. | 370/118 |
| 4,234,957 | 11/1980 | Tracey et al. | 375/120 |
| 4,314,368 | 2/1982 | Decoursey et al. | 370/110.1 |
| 4,450,572 | 5/1984 | Stewart et al. | 375/333 |
| 4,611,325 | 9/1986 | Jones, Jr., et al. | 370/110.1 |
| 4,651,320 | 3/1987 | Thapar | 375/261 |
| 4,759,041 | 7/1988 | Anderson et al. | 375/118 |
| 4,847,846 | 7/1989 | Baumbach et al. | 370/104.1 |
| 4,926,447 | 5/1990 | Corsetto et al. | 375/376 |
| 5,063,576 | 11/1991 | Eguchi et al. | 370/100.1 |
| 5,077,724 | 12/1991 | Ohtsuka | 370/100.1 |
| 5,146,585 | 9/1992 | Smith, III | 370/100.1 |
| 5,184,350 | 2/1993 | Dara | 370/105.3 |
| 5,241,543 | 8/1993 | Amada et al. | 370/100.1 |
| 5,363,418 | 11/1994 | Nakano et al. | 370/48 |
| 5,367,543 | 11/1994 | Uomoto | 370/105.1 |
| 5,394,442 | 2/1995 | Lill | 370/106 |

FOREIGN PATENT DOCUMENTS

| | | |
|---|---|---|
| 149279 | 4/1986 | Denmark. |
| 190 731 | 8/1986 | European Pat. Off.. |
| 491 054 | 6/1992 | European Pat. Off.. |
| 406 655 | 2/1979 | Sweden. |
| 2 216 366 | 10/1989 | United Kingdom. |

*Primary Examiner*—Douglas W. Olms
*Assistant Examiner*—Shick Hom
*Attorney, Agent, or Firm*—Burns, Doane, Swecker & Mathis, L.L.P.

[57] ABSTRACT

A composite reference signal distributes with one single signal both a clock signal and a synchronizing signal. This synchronizing signal is detected in a subsequent bit clocking generator for a high bit clocking frequency. Jitter that may exist on the edges of the clock signal will not influence the definition of the locally obtained synchronizing signal, and each data bit frame defined by the synchronizing signal will always include the exact number of data bits at the bit clocking frequency. The bit clocking generator includes a phase-locked loop, a dividing circuit, a shift register, and a logic gate for generating from the composite signal the bit clocking signal with its frame reference. In addition to the bit clocking frequency, a synchronizing pulse is obtained from the bit clocking generator that has high precision in relation to both the high frequency system clock and an external time domain transferred through the composite reference signal.

17 Claims, 2 Drawing Sheets

COMPOSITE CLOCK SIGNAL

TECHNICAL FIELD

The present invention relates to the field of clock control signals, and more particularly to timing with the aid of distributed clock signals and synchronizing signals in, for instance, a telecommunications system and with the aid of a composite clock signal, CLSY (Clock and Synch).

BACKGROUND ART

In telephony and telecommunications contexts, there is normally a general need for some form of clock and/or synchronizing signal distribution. This need is particularly extensive in large connected systems (the word large having a physical meaning), for instance switches which include various multiplexing stages.

In the case of large switches which comprise circuits mounted on circuit boards that are stored in magazines and cabinets, there is a need to distribute a relatively high frequency clock and a timing or synchronization pulse of lower frequency as a reference to framing, etc.

To this end, telecommunications equipment stored in a magazine or cabinet includes a considerable number of transmission means in the form of cables, connector pins in back planes and electric contacts, conductors in back planes, etc. The space required by all of these signal transmission devices is both large and expensive. The number of connector pins in the connectors is normally a resource which limits the size of a switch, for instance.

In earlier systems in which clock signal and synchronizing signal are intended to be distributed to all magazines and cabinets, there is, as a rule, used two coaxial cables or twisted-pair cables for all receivers. In other words, one coaxial cable for the high frequency clock and another coaxial cable for the synchronizing clock.

In a clock distribution in which the high frequency clock is distributed together with synchronizing pulses, this means that precision must be very high in order for the synchronizing signal not to arrive at the wrong place or to be interpreted on the wrong clocking flank or edge. Among other things, this places high demands on the mutual exactness of the lengths of the cables (clock and synchronizing signal supply) and the relationship of these cables to other cable pairs that have other destinations in the system.

Furthermore, the distribution of the actual high frequency clock signal with which the circuits actually operate also places high demands on screening of cables and devices together with good earthing of the cables and devices, etc., so that EMC-interference can be avoided and continued functioning can be managed and maintained.

A typical method of generating an accurate clock frequency is to depart from a high frequency oscillator and to divide the frequency down to the desired clock frequency, which is therewith obtained with good stability and a resolution accuracy which has been improved by the division factor.

A typical method of distributing clock signals is also to transmit a clock signal of lower frequency which, in turn, then controls some type of oscillator having a higher frequency from which the desired clock frequency is generated. Swedish Publication SE 406,655 discloses a particular solution for such technique. U.S. Publication U.S. Pat. No. 5,077,734 discloses a small private branch exchange in a digital network which applies this technique to generate a slightly higher clock frequency from a lower reference frequency.

French Publication EP-A1 0,190,731 discloses an arrangement comprising a receiver unit which delivers a clock signal and a synchronizing signal, wherein the receiver unit obtains from the transmitter, via repeaters, a clock signal which is followed by a synchronizing signal.

Finally, British Publication GB-A 2,216,366 discloses a timing generator in which a composite bit data stream is tapped-off and caused to generate a data bit clocking signal of 64 Khz and an 8 Khz signal for clocking bytes synchronously with this bit stream, wherein the clocking signals thus generated continue to provide correct clocking even should the bit data stream cease. In this case, the composite signal is based on bipolar or alternating inversion of the pulse for a binary "one".

None of the aforedescribed arrangements fully solves the basic problems of needing to be able to distribute a clock signal in, for instance, telecommunications equipment that may contain many planes while simultaneously working with clock frequencies in the order of hundreds of megahertz.

SUMMARY OF THE INVENTION

When practicing the present invention, there is obtained a composite reference signal, CLSY, which through one single signal readily distributes both external clock signals and synchronizing signals through simple modulation of this CLSY-signal, wherein detection of the synchronizing signal in a subsequent bit clocking frequency generator for generating a high bit clocking frequency $f_{BCL}$ has the result that any time jitter that may be present on the flanks or edges of the reference signal CLSY will not influence the definition of the secondary obtained local synchronizing signal, and wherein each data bit frame defined by the local synchronizing signal will always include precisely the intended number of data bits at the bit clocking frequency $f_{BCL}$.

According to the present invention, a bit clocking frequency generator comprising a PLL-circuit, a dividing circuit, a shift register and a logic circuit will interpret the synchronizing information stored on the reference signal and create a bit clocking frequency which is much higher than the clocking frequency of the CLSY-signal, there being obtained from the bit clocking frequency generator a synchronizing pulse which has high precision both in relation to its high frequency system clock and in relation to an external time domain transferred through the synchronizing signal in the composite reference signal CLSY.

In accordance with the present invention, CLSY includes a clock frequency which preferably lies solely in the range of 5–10 megahertz, whereas the bit clocking frequency, i.e. the system frequency, is in the order of hundreds of megahertz, while, at the same time, the synchronizing frequency may only be in the order of some tens of kilohertz or lower.

The present invention affords the following advantages:

Clock signals are distributed more easily from an EMC-aspect. The distribution medium need not have the same precision as when system clock and synchronizing are distributed separately. This enables, for instance, a single low quality optocable to be used.

Pins and space are saved in devices and back planes, etc., because the same physical signal paths are used for both clock signals and synchronizing signals.

Very good precision can be achieved, because the phase locked loop, the PLL-device, is allowed to generate both the local system clock and the synchronizing signal on one and the same chip.

In the illustrated case, the frequency f of the reference signal is, for instance, 5.12 Mhz and the external synchronizing signal SYN0 corresponds to a frequency $f_{SYN0}$ of 1/640 of the clock frequency for instance, i.e. a frequency of 8 KHz.

BRIEF DESCRIPTION OF THE DRAWINGS

The present invention will now be described with reference to a preferred exemplifying embodiment thereof and with reference to the accompanying drawings, in which.

BEST MODES OF CARRYING OUT THE INVENTION

Figure 1:
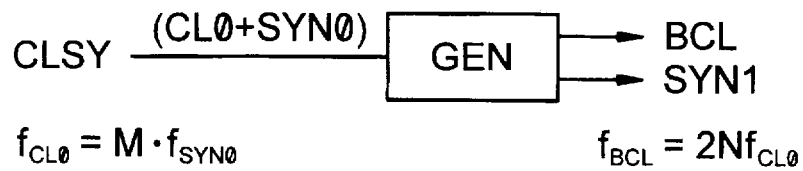
FIG. 1 illustrates generally and in block form a generator for producing a synchronizing signal and a high frequency bit clocking signal from a composite reference signal.

FIG. 1 illustrates generally a block which represents a generator GEN that operates to produce a synchronizing signal SYN1 and a high frequency bit clocking signal BCL from a composite reference signal CLSY which is comprised basically of an external clocking signal CL0. In the illustrated case, the frequency $f_{CLO}$ of the reference signal is, for instance, 5.12 Mhz and the external synchronizing signal SYN0 corresponds to a frequency $f_{SYN0}$ of 1/640 of the clock frequency for instance, i.e. a frequency of 8 Khz. Expressed by the formula $f_{CLO}=M \cdot f_{SYN0}$, M will equal 640 in the case of the illustrated embodiment. There is generated in the generator GEN an internal bit clocking signal BCL which has a frequency $f_{BCL}=184.32$ Mhz and in the case of the illustrative embodiment 2N will equal 36 in the formula $f_{BCL}=2N \cdot f_{CLO}$, with N thus equalling 18. There is also delivered from the generator GEN a local synchronizing signal SYN1 having the frequency $f_{SYN1}=8$ Khz, which is also related to the bit clocking signal BCL in its time domain and, at the same time, is related to the external synchronizing signal SYN0 through the inventive method of detecting the synchronizing signal SYN0 stored in the composite reference signal CLSY.

Figure 2:
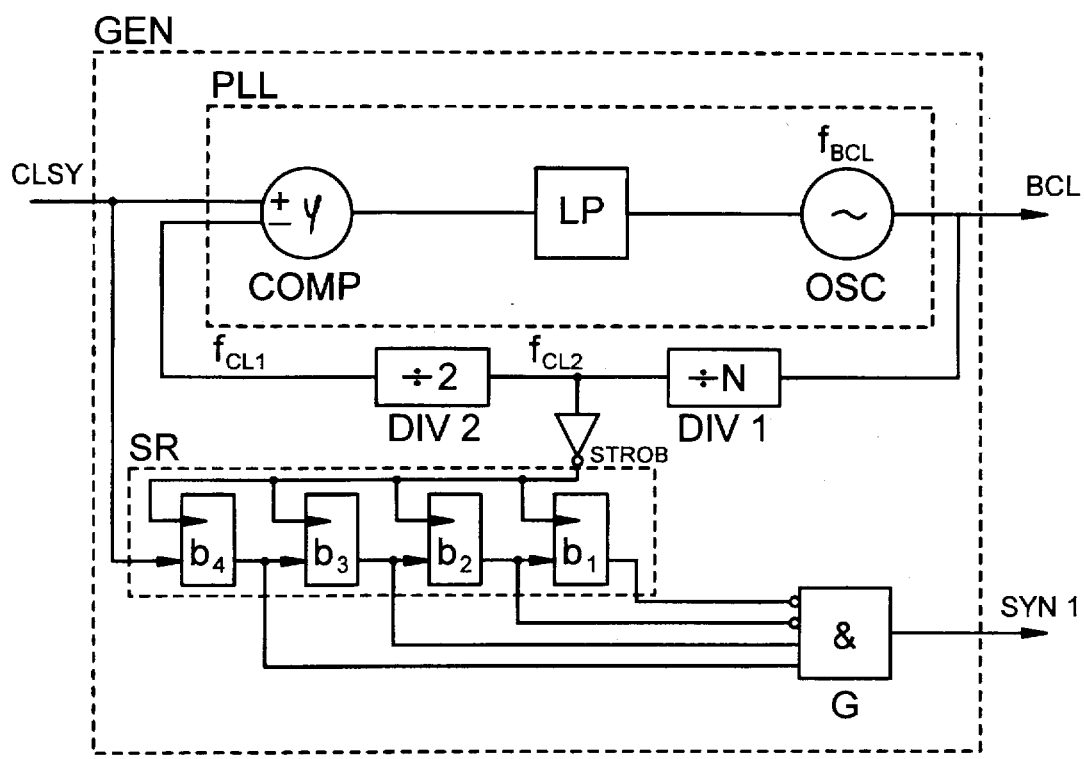
FIG. 2 illustrates in somewhat more detail an exemplifying embodiment of the invention, comprising a generator for obtaining from the clock signal contained in a composite reference signal a high frequency bit clocking signal and also to obtain a frame synchronizing signal from the synchronizing signal in the composite reference signal.

FIG. 2 illustrates an exemplifying embodiment of the present invention which comprises the generator GEN shown in FIG. 1, the main components of which include a frequency and phase locking loop PLL for generating the bit clocking frequency $f_{BCL}$, a frequency divider which includes two part-counters for generating from the frequency $f_{BCL}$ two frequencies $f_{CL1}$ and $f_{CL2}$, a circuit for generating a strobing signal STROB, a shift register SR including the four bits $b_1$–$b_4$ and a logic circuit in the form of a simple AND-gate for generating the synchronizing signal SYN1. The frequency and phase locking loop or circuit PLL also includes a multiplying comparator COMP, a lowpass filter LP and a voltage controlled oscillator OSC. The frequency and phase locking loop PLL which generates the bit clocking frequency $f_{BCL}$ may incorporate any standard circuit solution whatsoever known to the art. The bit clocking signal BCL delivered by the voltage controlled oscillator is divided by the factor N in a part-counter DIV1, this factor being equal to the integer 18 in the illustrated embodiment, to a frequency $f_{CL2}$, whereafter the frequency $f_{CL2}$ is divided down in a second part-counter DIV2 by a further factor of 2, to obtain a frequency $f_{CL1}$ which shall be equal to the clock frequency $f_{CLO}$ in the composite reference signal CLSY. Thus, in the illustrative embodiment, $f_{BCL}=184.32$ Mhz, $f_{CL2}=10.24$ Mhz and $f_{CL1}=5.12$ Mhz. The clock frequency $f_{CLO}$ for the composite reference signal CLSY is compared in the comparator with the frequency $f_{CL1}$ from the other part-counter. The comparator delivers a signal voltage which is proportional to the phase deviation and which, via the lowpass filter LP, endeavours to control the voltage controlled oscillator so that $f_{CL1}=f_{CLO}$ and so that the phase difference between the signals will be close to zero. The lowpass filter functions to make the regulating loop slow, which means that temporary deviations in the frequency $f_{CLO}$ will not immediately affect the voltage controlled oscillator. This means that when the phase controlled loop PLL has obtained a state of equilibrium, the frequency $f_{BCL}$ will be held stable even in the event of minor interferences, such as a temporary absence of the signal CLSY, and also that a stable bit clocking frequency will actually be obtained even though time jitter should occur in the incoming clock signal CL0.

Starting from the signal that has the frequency $f_{CL1}$, in the illustrated case a frequency of 10.24 Mhz, there is generated a strobing signal STROB which, together with the reference signal CLSY, is fed into, for instance, a shift register SR which, in the case of the illustrated preferred embodiment, has four bits $b_1$–$b_4$. The strobing signal STROB strobes the four bits $b_1$–$b_4$ in the shift register SR and the resultant signal on the output of the shift register is delivered to an AND-gate G, wherein in the case of the illustrated embodiment the last two outputs are inverted prior to delivering the signal to the gate G, i.e. the signals from the outputs $b_1$ and $b_2$. Consequently, this gives the condition that if the bit combination 0011 on the four outputs from the shift register are delivered simultaneously to the gate G, the gate will deliver, according to a known pattern, a signal during the time in which all of its inputs have a high logic level. Thus, in the preferred embodiment, the CLSY-signal has a binary configuration . . . 010100110101 . . . in association with a synchronizing signal. According to a basic exemplifying embodiment, in principle the shift register SR requires only two bits in order to detect a bit combination 11 or 00 capable of defining a synchronizing signal. In other words, in the synchronizing signal, CLSY can have a configuration . . . 1010110101 . . . and . . . 0101001010 . . . respectively in order to retain the phase in CLSY as seen totally, and it is beneficial in such an embodiment to construct the logic gate G to detect the bit combination 11 and 00 respectively, suitably alternately, delivered by the shift register SR, by arranging the logic circuit to function, for instance, alternately as an AND-gate having two inputs and alternately as a NOR-gate having two inputs. By increasing the number of bits that define the synchronizing signal, for instance to four bits as in the case of the preferred embodiment, the certainty that temporary inference will not generate a signal which is taken to be a synchronizing signal is further improved.

Figure 3:
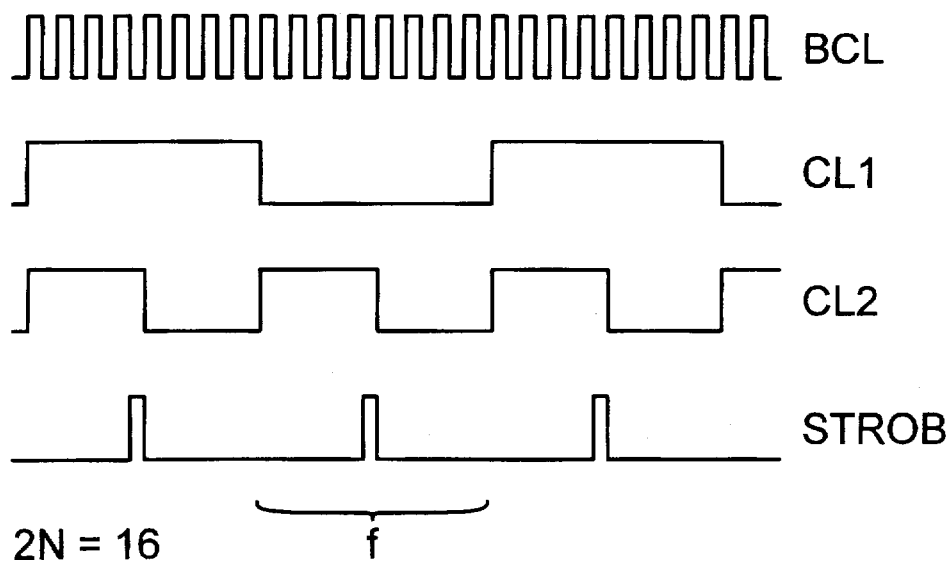
FIG. 3 illustrates the time relationship between a bit clocking signal, a first clock signal, a second clock signal, and a strobing signal in the generator according to FIG. 1.

With the intention of further illustrating the signal sequence, FIG. 3 illustrates a time slice which includes the signals BCL, CL1, CL2 and STROB for an imaginary case in which 2N=16, i.e. in which the frequency of the generated signal BCL is sixteen times higher than the frequency of the clock signal in the composite reference signal CLSY. It will be seen from FIG. 3 that a strobing signal STROB is generated conventionally with the aid of the signal CL2, and that the strobing signal will be centred or generally centred with the centre point of each half-period of the clock signal CL1, and therewith also with the clock signal CL0 in the composite reference signal CLSY, since these signals coincide as a result of the action of the frequency and phase locking circuit or loop PLL. The strobing signal pulses may, for instance, have a pulse length which conveniently corresponds to the pulse length of the bit clocking signal BCL and are generated in a known manner.

Figure 4:
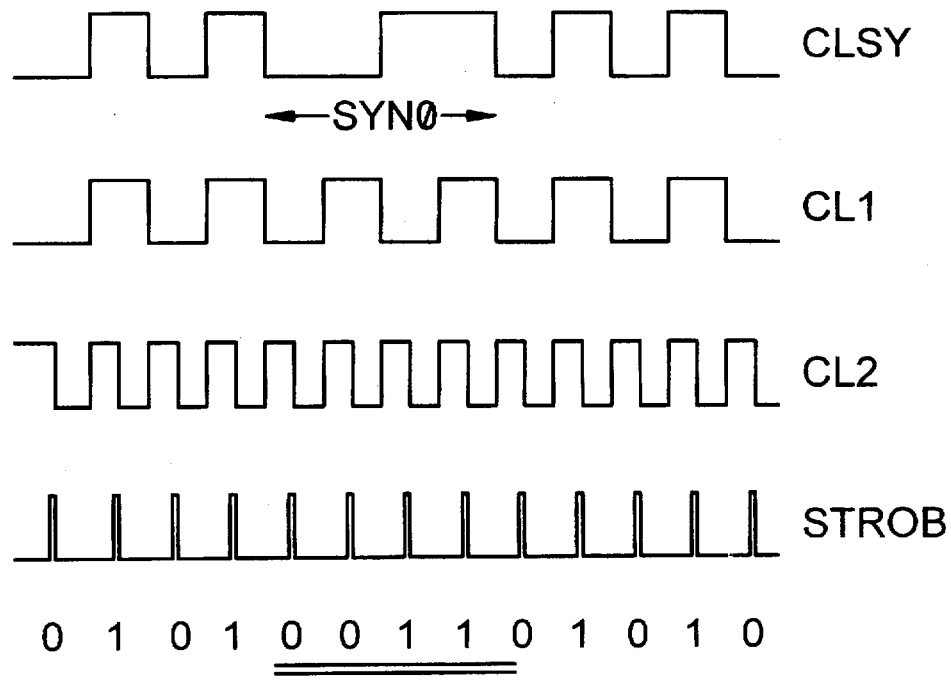
FIG. 4 illustrates the time relationship between a composite reference signal and the first clock signal, the second clock signal and the strobing signal when the reference signal presents a synchronizing pattern which defines a synchronizing signal.

FIG. 4 illustrates a time slice of the composite reference signal CLSY, and shows the signal to include a synchronizing signal SYN0. The Figure also shows in the same time scale the signals CL1, CL2 and STROB obtained in accordance with what has already been described above with reference to FIGS. 2 and 3. The binary result of the strobe effected with the strobing signal STROB against the signal CLSY is shown at the bottom of FIG. 4. When the signal CLSY has been shifted in the shift register SR in FIG. 2 so that the section referenced SYN0, and which in the illustrated embodiment has a length of four bits, $b_1$–$b_4$, is located in the shift register SR and is strobed by the strobing signal STROB, the binary values $b_1=0$, $b_2=0$, $b_3=1$ and $b_4=1$ are delivered in parallel to the inputs of the gate G in FIG. 2. Since the two inputs of the gate corresponding to $b_1$ and $b_2$ have been inverted, the gate G will obtain signals which have a high logic level on all of its four inputs and will therewith deliver a corresponding signal on its output SYN1. The signals obtained by strobing the shift register SR are suitably obtained with the same pulse lengths as the strobing signal STROB and the gate G will therewith also produce a pulse of the same order of magnitude as a one half-period of the bit clocking signal BCL. It will be obvious to one skilled in this art that it is equally as effective to, for instance, invert the two inputs corresponding to $b_3$ and $b_4$ instead and to use, for instance, a NOR-type gate instead of the AND-gate G. Correspondingly, an AND-gate whose inputs corresponding to the two bits $b_3$ and $b_4$ from the shift register are inverted instead would produce an output pulse for the bit combination 1100, i.e. in the case of the illustrative embodiment, the incorporated synchronizing signal would be comprised of a signal having two time intervals in the signal CLSY with high logic level followed by two time intervals with low logic level, where one time interval t corresponds to one half-period of the frequency $f_{CLO}$ or $f_{CL1}$.

By placing the strobing signal STROB centrally between two expected level changes in the signal CLSY with a high degree of accuracy, it is ensured that the synchronizing signal SYN0 will be sensed or strobed even should the clock signal CL0 in the composite reference signal have strong time jitter and a poorly defined transition between high and low logic levels. The inventive method ensures detection of the synchronizing signal SYN0 and, because the strobing signal STROB is located in the time domain of the bit clocking signal BCL, the synchronizing signal SYN1 is automatically related to the bit clocking signal and it is therewith guaranteed that there will be obtained from the bit clocking signal BCL precisely 2N·M clock pulses for a data bit frame that is defined by the synchronizing signal SYN0, i.e. through the frequency $f_{SYN1}$. The frequency $f_{SYN1}$ is thus simultaneously fully locked to the frequency $f_{BCL}$ of the bit clocking signal with maximum time resolution when the signal STROB which generates SYN1 has been obtained by dividing down the bit clocking signal BCL. In the illustrative embodiment, 2N is thus equal to 36 and M is equal to 640, which provides 23,040 clock pulses at the bit clocking frequency of 184.32 Mhz for each data bit frame having the synchronizing frequency of 8 Khz and which is obtained stably but with a transferred reference clock which runs solely at n frequency of 5.12 Mhz, which affords much better conditions for clock distribution than if it were effected at the higher frequency of 184.24 Mhz.

In an inventive system, each plane may have its own CLSY-signal. When generating the signals, CLSYn, n=1, 2, 3 . . . , it is ensured that their mutual phase relationship will not deviate by more than one-half time interval t, where t corresponds to one half-period of the clock frequency $f_{CLO}$ in the CLSY-signal. In other words, CLSYn must be located within a window which is suitable ½t=44 ns wide at a clocking frequency $f_{CLO}$=5.12 Mhz, in accordance with the illustrated embodiment. By suitable selection of a time constant through the lowpass filter LP in the phase locking loop PLL it is then possible for any plane whatsoever in the system to take over the composite reference signal CLSYn from any plane in the system whatsoever and at any time whatsoever, which provides an important safety redundancy in such a system.

We claim:

1. A method for distributing a common frame reference for a high frequency bit clocking generator through the medium of a composite clock and synchronizing signal, comprising the steps of:

forming said composite clock and synchronizing signal as a composite reference signal, said composite reference signal includes an external clock signal which with high frequency alternates between two logic levels, and an external synchronizing signal having a low frequency and stored in a signal of high frequency forming said external clock signal, the frequency of said external clock signal being an integer M times the frequency of said external synchronizing signal;

decoding said external synchronizing signal in said composite reference signal with high precision irrespective of any phase jitter that may occur on the edges of said reference clock signal since said reference clock signal includes within the time frame of a primary clock signal at least two mutually sequential intervals of the same logic level, preferably followed by a corresponding number of intervals having the opposite logic level, whereby one such interval corresponds to one half-period of said primary clock signal frequency; and sensing each of said intervals in the center of the interval between two expected signal edges.

2. A method according to claim 1, wherein when detecting said composite reference signal from said clock signal in said composite reference signal, a bit clocking signal frequency is created which is a multiple of said external clock signal frequency in said composite reference signal by a factor equal to twice an integer N; and wherein at the same time a first clock signal frequency is created by dividing said bit clocking frequency by 2N; said first clock signal frequency being compared with said external clock signal frequency in a frequency and phase locking circuit and creating a second signal frequency by dividing said bit clocking frequency by N; said second clock signal frequency being intended to be used to create a strobing signal for detection of said synchronizing signal in said composite reference signal.

3. A method according to claim 2, wherein by aligning said strobing signal by displacement through one-half of a time interval in relation to said first clock frequency and therewith at the same time in relation to said external clock frequency for reading said external clock signal in the interval centrally between a positive and a negative edge or the transitions between the two logic levels which form said external clock signal in said composite reference signal and whose signal edges generally jitter.

4. A method according to claim 3, wherein said external synchronizing signal exists close to said strobing signal in said composite reference signal and is detected during several mutually sequential intervals having the same logic level followed preferably by a corresponding number of intervals having the opposite logic level.

5. A method according to claim 4, wherein by virtue of said bit clocking signal creating a factor 2N which is twice a primary clock signal, a data frame is obtained against the synchronizing signal which constantly contains exactly 2N×M data bits, and in that said bit clocking signal and a frame synchronizing signal are referred to said composite reference signal with sufficient precision.

6. A method according to claim 5, wherein a selective composite reference signal CLSYn, representing a selective plane in the system is used to create said bit clocking signal and said frame synchronizing signal in the system when said selective composite reference signal CLSYn has a mutual time difference which is below one-half time interval.

7. A method according to claim 3, wherein said external synchronizing signal lies close to said strobing signal in said composite reference signal and is detected during two mutually sequential intervals having the same logic level, followed by two intervals having the opposite logic level.

8. A method according to claim 7, wherein by virtue of said bit clocking signal creating a factor 2N which is twice a primary clock signal, a data bit frame is obtained against the synchronizing signal which constantly contains exactly 2N×M data bits, and in that said bit clocking signal and said frame synchronizing signal are referred to said composite reference signal with sufficient precision.

9. A method according to claim 8, wherein by using said selective composite reference signal CLSYn, representing a selective plane in the system is used to create said bit clocking signal and the frame synchronizing signal in the system when said selective composite reference signal CLSYn has a mutual time difference which is below one-half time interval.

10. An arrangement for using a composite reference signal to create a high frequency bit clocking signal, said arrangement comprising:

a phase locking circuit including a comparator, a lowpass filter, an oscillator and a frequency divider, wherein said frequency divider is divided into a first divider which divides with an integer N, to obtain a second clock frequency which is used to create a strobing signal; and wherein said frequency divider also includes a further second divider which divides by a factor 2, to obtain a first clock frequency which is equal to a reference frequency in said composite reference signal for use in the phase locking circuit; and a shift register having a number of steps corresponding to the number of bits in a signal which defines a synchronizing signal in said composite reference signal; said composite reference signal being fed into said shift register and said shift register strobes with said strobing signal to create an input to a logic circuit for detecting and generating a synchronizing signal with a locked relationship to a bit clocking frequency.

11. An arrangement according to claim 10, wherein said logic gate circuit has a number of inputs which correspond to the number of steps in said shift register, whereby preferably a first half or a second half of said gate circuit inputs are provided with an inverting device so as to obtain from the composite reference signal a synchronizing condition in said composite reference signal with the aid of the logic gate circuit.

12. An arrangement according to claim 11, wherein a synchronizing condition in said composite reference signal is defined by the presence of several mutually sequential intervals having the same logic level, followed by a corresponding number of intervals having the opposite logic level, wherein one such interval is equal to one half-period of said primary clock signal frequency.

13. An arrangement according to claim 11, wherein a synchronizing condition in said composite reference signal is defined by the presence of two mutually sequential intervals having the same logic level followed by two intervals having the opposite logic level, wherein one such interval is equal to one half-period of said primary clock signal frequency.

14. An apparatus for creating an internal high frequency bit clocking signal and an internal synchronizing signal in a system, comprising:

means for receiving a composite reference signal including a clock signal and an external synchronizing signal; and means for generating the internal high frequency bit clocking signal and the internal synchronizing signal using said composite reference signal;

wherein said external synchronizing signal is defined by the presence of several mutually sequential intervals having the same logic level, followed by a corresponding number of intervals having the opposite logic level.

15. The apparatus according to claim 14, wherein binary bit information 0011 is included in the time frame for a clock frequency of said clock signal as a characteristic of said external synchronizing signal in said composite reference signal.

16. The apparatus according to claim 14, wherein binary bit information 1100 is included in the time frame for a clock frequency of said clock signal as a characteristic of said external synchronizing signal in said composite reference signal.

17. The apparatus according to claim 14, wherein one of said intervals interval is equal to one half-period of a primary clock signal frequency.

* * * * *